United States Patent [19]

Ogawa

[11] 4,425,416

[45] Jan. 10, 1984

[54] COLOR FILTER AND METHOD FOR MANUFACTURING THE SAME

[75] Inventor: Kazufumi Ogawa, Hirakata, Japan

[73] Assignee: Matsushita Electric Industrial Co., Ltd., Osaka, Japan

[21] Appl. No.: 368,026

[22] Filed: Apr. 13, 1982

[30] Foreign Application Priority Data

Apr. 20, 1981 [JP] Japan .................................. 56-60404

[51] Int. Cl.³ .............................................. G03F 5/00
[52] U.S. Cl. ....................................... 430/7; 430/293;
430/294; 430/321; 427/38; 427/43.1; 350/316;
350/162.12
[58] Field of Search .................. 430/7, 293, 294, 321;
427/38, 43.1; 350/162 SF, 316

[56] References Cited

U.S. PATENT DOCUMENTS

| | | | |
|---|---|---|---|
| 3,920,483 | 11/1975 | Johnson et al. | 427/38 |
| 4,183,780 | 1/1980 | McKenna et al. | 427/38 |
| 4,253,888 | 3/1981 | Kikuchi | 427/43.1 |
| 4,263,385 | 4/1981 | Pampalone | 427/43.1 |
| 4,278,754 | 7/1981 | Yamashita et al. | 427/43.1 |
| 4,357,415 | 11/1982 | Hartman | 430/7 |

OTHER PUBLICATIONS

Schuller et al., Defensive Publication T883,005, Published Feb. 2, 1971.

Primary Examiner—J. Travis Brown
Attorney, Agent, or Firm—Burgess, Ryan & Wayne

[57] ABSTRACT

The invention provides a novel color filter used for an image pickup device for a color TV receiver and a method for manufacturing the color filter. More particularly, transparent layers to adhere color pattern layers to each other are not formed below second and third color pattern layers. Meanwhile, the surfaces of the precolored resin layers are exposed to a plasma atmosphere so that surfaces of color pattern layers are polymerized to form intermediate polymerized layers to separate the precolored resin layers. Therefore, blurs are eliminated from the second and third color pattern layers. Further, adhesion of the precolored resin layers is great.

18 Claims, 9 Drawing Figures

COLOR FILTER AND METHOD FOR MANUFACTURING THE SAME

BACKGROUND OF THE INVENTION

The present invention relates to a color filter on which a plurality of color separation layers are formed in an arbitrary pattern and a method for manufacturing the same.

Various conventional color filters have been proposed. For example, an intermediate layer is formed between color pattern layers to prevent adhesion between the color pattern layers and to prevent dyeing of a color pattern layer with a different color or colors when another color pattern layer is formed thereon. Alternatively, dyed color pattern layers are treated with solutions of tannic acid and potassium tartrate without forming an intermediate layer between the dyed color pattern layers.

However, in the first conventional color filter described above, the interface between the intermediate layer and the color pattern layer is subject to peeling. Further, since a step is formed between the adjacent color pattern layers, pattern resolution is degraded. In the second conventional color filter described above, the dyeing pattern layers are corroded by chemicals. Turbidity and blur occur in the color pattern.

SUMMARY OF THE INVENTION

An object of the present invention is to provide a color filter with no intermediate layer formed between adjacent color pattern layers and tends to peel from a color pattern layer and a method for manufacturing the same.

According to a method for manufacturing a color filter of the present invention, each surface of a precolored resin is exposed to a plasma gas and only the surface layer thereof is polymerized. Therefore, a very thin transparent intermediate layer is formed with high precision only on the surfaces of the color pattern layers of the color filter. Thus, good reproducibility is obtained, resulting a variety of industrial applications.

The other objects, features, and advantages of the present invention will be apparent from the following description taken in conjunction with the accompanying drawings.

DETAILED DESCRIPTION OF THE INVENTION

Description of the Prior Arts

Figure 1A:
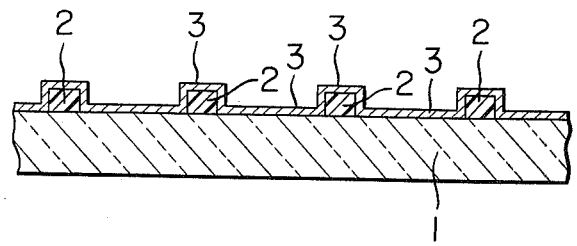
FIGS. 1A to 1C and 1D are sectional views and a plan view, respectively, of a conventional color filter for explaining a method for manufacturing the same.

Conventionally, a method as shown in FIGS. 1A to 1D has been generally used for manufacturing the first color filter of this type. Ammonium dichromate is added to polyvinyl alcohol, a glue, gelatine, casein or the like to obtain a sensitizer. The sensitizer is then applied by roller coating, dipping or spinning to uniformly cover the surface of a glass substrate 1 which is abraded. After the sensitizer is dried, a pattern layer 2 to be dyed by a first color is hardened optically by masking. The hardened pattern layer 2 is then developed to eliminate an unnecessary sensitizer portion. The pattern layer 2 is dyed by a first dye with a predetermined spectral characteristic. A transparent intermediate layer 3 which may not be dyed is formed to cover the entire surface (FIG. 1A).

Figure 1B:
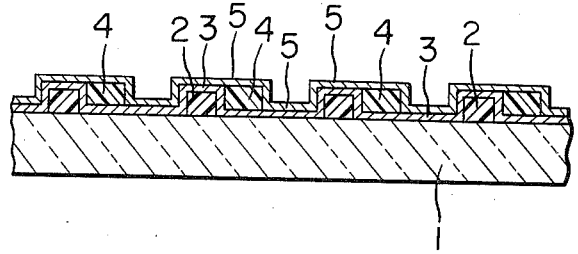

The sensitizer is then applied uniformly to cover the entire surface, as shown in FIG. 1B. After the sensitizer is dried, a pattern layer 4 to be dyed by a second color is hardened optically by masking. The hardened pattern layer 4 is then developed to eliminate an unnecessary sensitizer portion. The pattern layer 4 is dyed by a second dye with a predetermined spectral characteristic. A transparent intermediate layer 5 is then formed to cover the pattern layer 4.

Figure 1C:
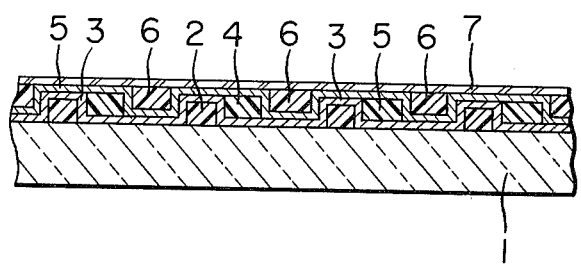

As shown in FIG. 1C, the same sensitizer is applied uniformly to cover the intermediate layer 5. After the sensitizer is dried, a pattern layer 6 to be dyed by a third color is hardened optically by masking. The hardened pattern layer 6 is then dyed by a third dye with a predetermined spectral characteristic.

Figure 1D:
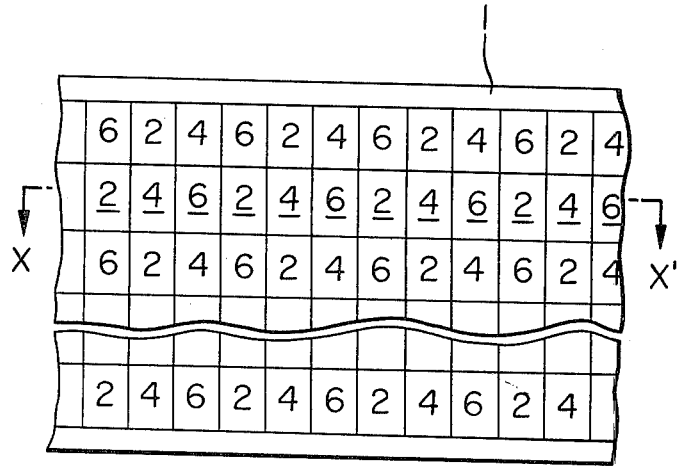

Finally, a top layer 7 is formed and a color filter shown in FIG. 1D is manufactured.

However, in order to form the pattern layer 2 of the first color, the pattern layer 4 of the second color, the pattern layer 6 of the third color according to the above method, substrate conditions differ from each other. As shown in FIG. 1C, the pattern layer 2 of the first color is directly formed on the glass substrate 1. The pattern layer 4 of the second color is formed on the intermediate layer 3. The pattern layer 6 of the third color is formed on the intermediate layers 3 and 5.

Adhesion of the sensitizer to the glass substrate 1 differs from that to the intermediate layers 3 and 5. Therefore, if a sensitizer which is easily adhered to the glass substrate 1 is used, the interface between the intermediate layers is subject to peeling. At present, a number of defective color filters are manufactured for this reason. Further, since the pattern layers of the first, second and third colors have respective steps, pattern resolution is degraded when pattern layers of the second and third colors are subsequently formed on the pattern layer of the first color through the intermediate layers. As a result, the color pattern layers tend to blur.

Another conventional method is proposed for manufacturing a color filter without forming an intermediate layer. The dyed pattern layers are treated with solutions of tannic acid and potassium tartrate, as disclosed in Japanese Laid-Open Patent Application No. 2675/1981. However, the dyed pattern layers may be corroded by the chemicals described above. The dye may be partially melted from the dyed pattern layers and the spectral characteristics of the dye may be changed. Therefore, exposure with a strong chemical cannot be performed. Thus, the dyed color of the pattern layer may become turbid and blur when another pattern layer is dyed with a different color. Thus, a consistent manufacturing process cannot be established.

DESCRIPTION OF THE PREFERRED EMBODIMENT

Figure 2A:
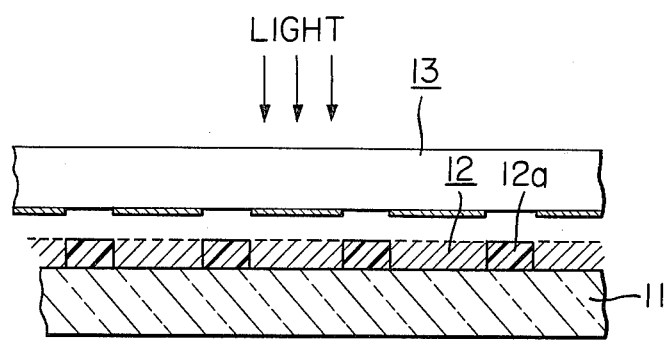
FIGS. 2A to 2C are sectional views of a color filter for explaining a method for manufacturing the same according to one embodiment of the present invention.

Referring to FIG. 2A, a sensitizer is uniformly applied by roller coating or spinning to cover the entire surface of a glass substrate 11. The glass substrate 11 may comprise, for example, Corning 7740 of 0.5 mm thickness. The sensitizer comprises a water soluble resist film such as polyvinyl alcohol, a glue, gelatine, and casein or a resist film such as PMMA and polyvinyl cinnamate which have amino groups in the molecule which are soluble in organic solvents. If gelatine or casein with a viscosity of 100 to 200 cps is used as the sensitizer, a sensitizer film 12 can be uniformly formed to a thickness of 0.7 μm by a spinner. The glass substrate 11 which has the sensitizer film 12 thereon is dried in a suitable baking furnace. If the sensitizer is a casein or gelatine sensitizer, the glass substrate 11 is baked at a temperature of 60° C. for about 10 to 20 minutes. If the sensitizer comprises polyvinyl cinnamate having terminal amino groups, the glass substrate 11 is baked at a temperature of 90° C. for about 30 minutes. After the glass substrate 11 with the sensitizer film 12 is dried, it is exposed, using a mask 13 having a predetermined pattern. The glass substrate 11 is then developed by a developer. If a casein or gelatine sensitizer is used, the pattern is developed by warm water or cool water. A color base pattern layer 12a to be dyed is thus formed. Thereafter, the glass substrate 11 having the color base pattern layer 12a thereon is baked and the color base pattern layer 12a is dyed by a dye with a predetermined spectral characteristic.

Figure 2B:
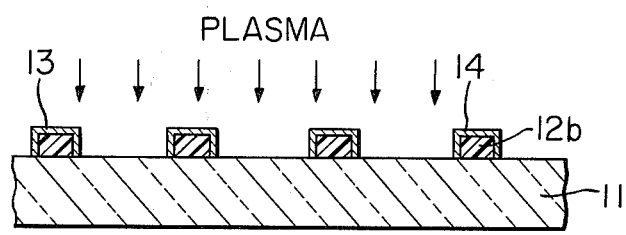

A color pattern layer 12b dyed as shown in FIG. 2B is exposed to a plasma of a fluorocarbon for a few minutes to dissociate carbon from hydrogen in the surface layer of the pattern layer 12b and to bond carbon to fluorine. Thus, the surface layer of the pattern layer 12b is changed to an intermediate layer of a polymer containing fluorocarbon. The vacuum pressure of the plasma is 0.35 to 0.4 Torr and the reaction gas is carbon tetrafluoride gas. A high frequency power of 20 W is supplied. The color pattern layer 12b is then exposed to the plasma for about 5 minutes.

Figure 3A:
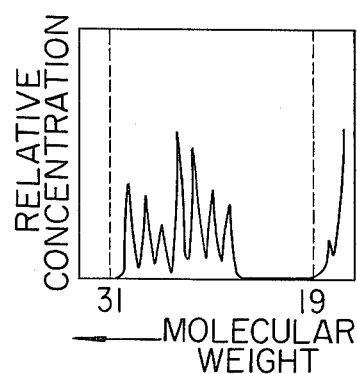
FIGS. 3A and 3B are graphs for explaining secondary ion mass spectrography (SIMS) before exposure and after exposure in case a surface layer of gelatine is treated in a $CF_4$ plasma.
Figure 3B:
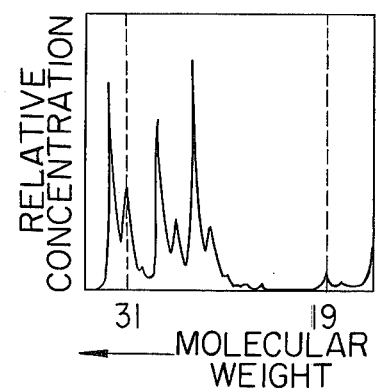

Results of the above exposure are described below. Gelatine was applied to a thickness of 1.0 μm and reacted in an atmosphere of a plasma to form a sensitizer film 12. Analysis results according to SIMS (secondary ion mass spectrography) tests are shown in FIGS. 3A and 3B. The relative concentration of the molecule of each is plotted along the vertical coordinate, while the molecular weight of each is plotted along the horizontal coordinate. FIG. 3A shows a case in which the sensitizer film 12 is not exposed to a plasma atmosphere, while FIG. 3B shows a case in which the sensitizer film 12 is exposed to the plasma atmosphere.

As is apparent from FIG. 3A, the relative concentration (relative to carbon) is substantially zero when the molecular weight of fluorine is 19 and the molecular weight of carbon fluoride is 31. However, referring to FIG. 3B, the relative concentration is present when the molecular weights of carbon and carbon fluoride are respectively 19 and 31. Thus, when the sensitizer film 12 is exposed to the plasma atmosphere, fluorine or carbon fluoride bond is present.

In practice, as shown in FIG. 2B, a very thin intermediate layer 14 was formed which was inert to the dye and which did not permit the dye to permeate.

Figure 2C:
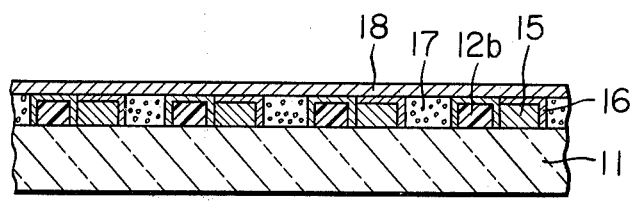

Similarly, as shown in FIG. 2C, the sensitizer is applied over the entire surface again and exposed using a mask. After the sensitizer film 12 is developed, a base pattern to be dyed by a second color is formed. This base pattern is then dyed by a dye with a predetermined spectral characteristic, and a pattern layer 15 is formed.

Subsequently, an intermediate layer 16 is formed on the pattern layer 15 by exposing to a plasma atmosphere.

In the same manner as described above, a color pattern layer 17 to be dyed with a third color is formed, and then a top layer 18 is then formed thereon as a protective layer. Thus, the color filter as shown in FIG. 2C. is manufactured.

In the above embodiment, a case is described wherein the color filter film is formed on a glass plate. However, a color filter film may be directly formed on a solid state pickup image element. In this case, a transparent resin film is formed to a thickness 1 to 2 μm on the transparent resin film. Then, the surface of the solid state pickup image element is smoothened for easy formation of a pattern.

The gas is not limited to a fluorocarbon gas. An inert gas such as $N_2$ or Ar may be used. In this case, the intermediate layer is inert to the dye, has an improved degree of polymerization, and does not allow osmosis of the dye.

Further, in the above embodiment, a filter of three colors is manufactured. However, the number of colors is not limited but may be extended to any number of colors. A black line may be formed between adjacent different colors. The intermediate layer is made of a transparent material which is not influenced by the spectral characteristics of the color pattern layers. The top layer is made of the same transparent material as the intermediate layer which is not influenced by the spectral characteristics of the color pattern layers and which protects the color pattern layers.

The compositions (a) of the dyes, dyeing temperatures (b) and dyeing durations (c) are determined in accordance with the spectral characteristics of each stripe filter or mosaic. Examples are shown below when dyes of green, blue and red are used:

| (a) Composition | |
|---|---|
| Green: | |
| Kayanol Yellow N5G (trade name: NIPPON KAYAKU CO., LTD., Japan) | 5 g |
| Acid Milling Green B (trade name: SUMITOMO CHEMICAL CO., LTD., Japan) | 0.3 g |
| Acetic acid | 2 cc |
| Water | 100 g |
| Blue: | |
| Chibacroran Blue (trade name: Chiba-Geigy, Switzerland) | 1 g |
| Acid Cyanine 6B (trade name: SUMITOMO CHEMICAL CO., LTD., Japan) | 0.1 g |
| Acid Violet 6B (trade name: SUMITOMO CHEMICAL CO., LTD., Japan) | 0.05 g |
| Acetic acid | 2 cc |
| Carasol (trade name: DAI-ICHI KOGYO SEIYAKU, Japan) | 1 cc |
| Water | 100 g |
| Red: | |
| Suminol Fast Red (trade name: SUMITOMO CHEMICAL CO., LTD., Japan) | 1.5 g |
| Red 3BW (trade name: SUMITOMO CHEMICAL CO., LTD., Japan) | 0.5 g |
| Orange 2G (trade name: SUMITOMO CHEMICAL CO., LTD., Japan) | 1 g |
| Orange I (trade name: SUMITOMO CHEMICAL CO., LTD., Japan) | 0.5 g |
| Carasol (trade name: DAI-ICHI KOGYO SEIYAKU CO., LTD., Japan) | 1 cc |
| Acetic acid | 2 cc |
| Water | 100 g |
| (b) Dyeing Temperature | |
| Green 80° C. | |
| Blue 70° C. | |
| Red 60° C. | |

-continued

| (c) Dyeing Duration | |
| --- | --- |
| Green | 5 min. |
| Blue | 4 min. |
| Red | 3 min. |

Note: Carasol is a levelling agent and the others are dyes.

What is claimed is:

1. A color filter having different discrete adjacent colored areas formed on a substrate to form color patterns on the substrate comprising a first pattern of a dyed resist formed on said substrate with a surface layer only of said dyed resist having been formed into a polymeric film by exposing to a plasma gas, and a second and subsequent patterns of a number equal to the number of colors used of dyed resists serially formed on said substrate and each having a surface layer only formed into a polymeric film by exposing to a plasma gas.

2. A color filter according to claim 1, wherein said substrate comprises a transparent plate.

3. A color filter according to claim 1, wherein said substrate comprises a solid state image pickup element.

4. A color filter according to claim 1, wherein each of said polymeric films is transparent.

5. A color filter according to claim 1, wherein a black line is drawn between color regions of said color patterns.

6. A method for manufacturing a color filter comprising:

a first step of coating a sensitizer on a substrate to form a sensitizer film, exposing said sensitizer film to light using a mask, developing said sensitizer film, and forming a first pattern of said sensitizer film;

a second step of dyeing said first pattern by a predetermined dye;

a third step of exposing said first pattern dyed by said predetermined dye to a plasma gas to form a polymeric film by a chemical reaction on a surface layer of said first pattern; and a fourth step of repeating a plurality of times the first to third steps and forming desired subsequent color patterns.

7. A method according to claim 6, wherein said substrate comprises a transparent plate.

8. A method according to claim 6, wherein said substrate comprises a solid state image pickup element.

9. A method according to claim 1, wherein the chemical reaction is a polymerization reaction.

10. A method according to claim 6, wherein the plasma gas is formed by ionizing at least one of a fluorocarbon and an inert gas.

11. A method according to claim 6, wherein a black line is drawn between color regions of the color patterns of said first and subsequent patterns.

12. A color filter according to claim 1, wherein the number of colors used is three.

13. A color filter according to claim 1, wherein the plasma gas is a fluorocarbon gas or an inert gas.

14. A color filter according to claim 1, further comprising a protective layer of a polymeric film formed over all of said color patterns.

15. A method according to claim 6, wherein said first to third steps are repeated twice to form a total of three desired color patterns.

16. A method according to claim 6, wherein said plasma gas is a fluorocarbon gas or an inert gas.

17. A method according to claim 6, further comprising a fifth step of forming a protective layer over all of the color patterns.

18. A color filter according to claim 1, wherein said first and second subsequent patterns are formed directly on said substrate.

* * * * *